United States Patent
Cheng et al.

(10) Patent No.: US 10,535,733 B2
(45) Date of Patent: Jan. 14, 2020

(54) METHOD OF FORMING A NANOSHEET TRANSISTOR

(71) Applicant: INTERNATIONAL BUSINESS MACHINES CORPORATION, Armonk, NY (US)

(72) Inventors: Kangguo Cheng, Schenectady, NY (US); Choonghyun Lee, Rensselaer, NY (US); Juntao Li, Cohoes, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/868,003

(22) Filed: Jan. 11, 2018

(65) Prior Publication Data
US 2019/0214459 A1  Jul. 11, 2019

(51) Int. Cl.
*H01L 29/06* (2006.01)
*H01L 29/423* (2006.01)
*H01L 29/78* (2006.01)
*H01L 21/02* (2006.01)
*H01L 29/66* (2006.01)

(52) U.S. Cl.
CPC .... *H01L 29/0673* (2013.01); *H01L 21/02532* (2013.01); *H01L 21/02603* (2013.01); *H01L 29/42392* (2013.01); *H01L 29/66795* (2013.01); *H01L 29/785* (2013.01)

(58) Field of Classification Search
CPC . H01L 51/56; H01L 51/5012; H01L 51/5056; H01L 51/5072; H01L 51/0097
USPC .......................................................... 257/327
See application file for complete search history.

(56) References Cited

U.S. PATENT DOCUMENTS

| | | | |
|---|---|---|---|
| 9,362,355 B1 | 6/2016 | Cheng et al. | |
| 9,620,590 B1 | 4/2017 | Bergendahl et al. | |
| 9,972,701 B2* | 5/2018 | Kim | H01L 29/0673 |
| 2016/0126310 A1 | 5/2016 | Rodder et al. | |
| 2016/0293733 A1* | 10/2016 | Leobandung | H01L 29/0673 |
| 2017/0069481 A1 | 3/2017 | Doris et al. | |

(Continued)

OTHER PUBLICATIONS

Disclosed Anonymously "Improved Spacer for Nano Sheet Transistors"; ip.com; IP.com No. IPCOM000244655D; IP.com Electronic Publication Date: Jan. 5, 2016; 5 pgs.

(Continued)

*Primary Examiner* — Andy Huynh
(74) *Attorney, Agent, or Firm* — Cantor Colburn LLP; Vazken Alexanian

(57) ABSTRACT

A sacrificial gate stack for forming a nanosheet transistor includes a substrate, first, second and third silicon channel nanosheets formed over the substrate, and a first sandwich of germanium (Ge) containing layers disposed between the substrate and first silicon channel nanosheet. The stack also includes a second sandwich of Ge containing layers disposed between the first silicon channel nanosheet and the second silicon channel nanosheet; and a third sandwich of Ge containing layers disposed between the second silicon channel nanosheet and the third silicon channel nanosheet. Each sandwich includes first and second low Ge containing layers surrounding a silicon germanium (SiGe) sacrificial nanosheet that has a higher Ge concentration than the first and second low Ge containing layers.

9 Claims, 16 Drawing Sheets

(56) References Cited

U.S. PATENT DOCUMENTS

| | | |
|---|---|---|
| 2017/0221992 A1 | 8/2017 | Chang et al. |
| 2017/0263704 A1 | 9/2017 | Kittl et al. |
| 2018/0197794 A1 | 7/2018 | Kang et al. |
| 2018/0254321 A1 | 9/2018 | Wostyn et al. |
| 2018/0301531 A1 | 10/2018 | Xie |
| 2019/0035888 A1* | 1/2019 | Wu .................... H01L 29/0673 |

OTHER PUBLICATIONS

Loubet, N. et al., "Stacked Nanosheet Gate-All-Around Transistor to Enable Scaling Beyond FinFET", 2017 Symposium on VLSI Technology Digest of Technical Papers; pp. T230-T231.

* cited by examiner

METHOD OF FORMING A NANOSHEET TRANSISTOR

BACKGROUND

The present invention relates in general to semiconductor devices and their fabrication. More specifically, the present invention relates to the fabrication of vertically stacked nanosheet transistors having inner spacers between the gate metal and the source/drain sheet.

In contemporary semiconductor device fabrication, a large number of semiconductor devices, such as field effect transistors (FETs), are fabricated on a single wafer. Non-planar transistor device architectures, such as nanosheet transistors, can provide increased device density and increased performance over planar transistors. In nanosheet transistors, in contrast to conventional planar FETs, the gate stack wraps around the full perimeter of multiple nanosheet channel regions, which enables fuller depletion in the channel regions and reduces short-channel effects.

SUMMARY

Embodiments of the present invention are directed to a method of forming a nanosheet transistor. One embodiment includes: forming a substrate; forming a first low germanium (Ge) containing layer over the substrate; forming a first silicon germanium (SiGe) sacrificial nanosheet over the first low Ge containing layer, wherein the first SiGe sacrificial nanosheet has a higher Ge content than the first low Ge containing layer; forming a second low Ge containing layer on the first SiGe sacrificial nanosheet; forming a first silicon channel nanosheet on the second low Ge containing layer; performing a first etch on the first and second low Ge containing layers and the SiGe sacrificial nanosheet to form first recesses in the SiGe sacrificial nanosheet; depositing a layer of germanium oxide over the substrate and the first silicon channel nanosheet and on sides of the first and second low Ge containing layers and sides of the first SiGe sacrificial nanosheet to form an intermediate gate stack; annealing the intermediate gate stack to produce a silicon oxide ($SiO_2$) where the layer of germanium oxide contacts the first SiGe sacrificial nanosheet in the first recesses; removing the layer of germanium oxide; performing a second etch on the first and second low Ge containing layers; removing the silicon oxide ($SiO_2$) to form recesses between the substrate and first silicon channel nanosheet; forming spacers in the uniform recesses to create a modified sacrificial gate stack; forming a source on side of the modified sacrificial gate stack and a drain on another side of the modified sacrificial gate stack; removing the first and second low Ge containing layers and the SiGe sacrificial nanosheet from the modified sacrificial gate stack; and forming a final gate stack by depositing a metal in regions formerly occupied by the first and second low Ge containing layers and the SiGe sacrificial nanosheet.

According to one embodiment, a method of forming a sacrificial gate stack of a nanosheet transistor is disclosed and includes: forming first stack of at least three silicon channel nanosheets over a substrate, wherein the three silicon channel nanosheets are separated from each other by a sandwich of germanium (Ge) containing layers, each sandwich including first and second low Ge containing layers surrounding a silicon germanium (SiGe) sacrificial nanosheet that has a higher Ge concentration than the first and second low Ge containing layers; forming and patterning a mask over a top one the at least three silicon channel nanosheets; forming a Si/SiGe nanosheet stack by removing portions of the three silicon channel nanosheets and the germanium (Ge) contain layers not covered by the mask; forming a dummy gate on the mask and forming silicon nitride spacers on side of the dummy gate; performing a first etch on Si/SiGe nanosheet stack to form first recesses in the SiGe sacrificial nanosheets; depositing a layer of germanium oxide over Si/SiGe nanosheet stack and the dummy to form an intermediate gate stack; annealing the intermediate gate stack to produce a silicon oxide ($SiO_2$) where the layer of germanium oxide contacts the first SiGe sacrificial nanosheet in the first recesses; removing the layer of germanium oxide; performing a second etch on the intermediate gate stack; removing the $SiO_2$ to form a uniform recesses in the sandwiches of Ge containing layers; and forming spacers in the uniform recesses to create a final sacrificial gate stack.

In one embodiment, a sacrificial gate stack for forming a nanosheet transistor is disclosed. The sacrificial gate stack includes: a substrate; first, second and third silicon channel nanosheets formed over the substrate, a first sandwich of germanium (Ge) containing layers disposed between the substrate and first silicon channel nanosheet; a second sandwich of Ge containing layers disposed between the first silicon channel nanosheet and the second silicon channel nanosheet; a third sandwich of Ge containing layers disposed between the second silicon channel nanosheet and the third silicon channel nanosheet. Each sandwich includes first and second low Ge containing layers surrounding a silicon germanium (SiGe) sacrificial nanosheet that has a higher Ge concentration than the first and second low Ge containing layers.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

DETAILED DESCRIPTION

Figure 1:
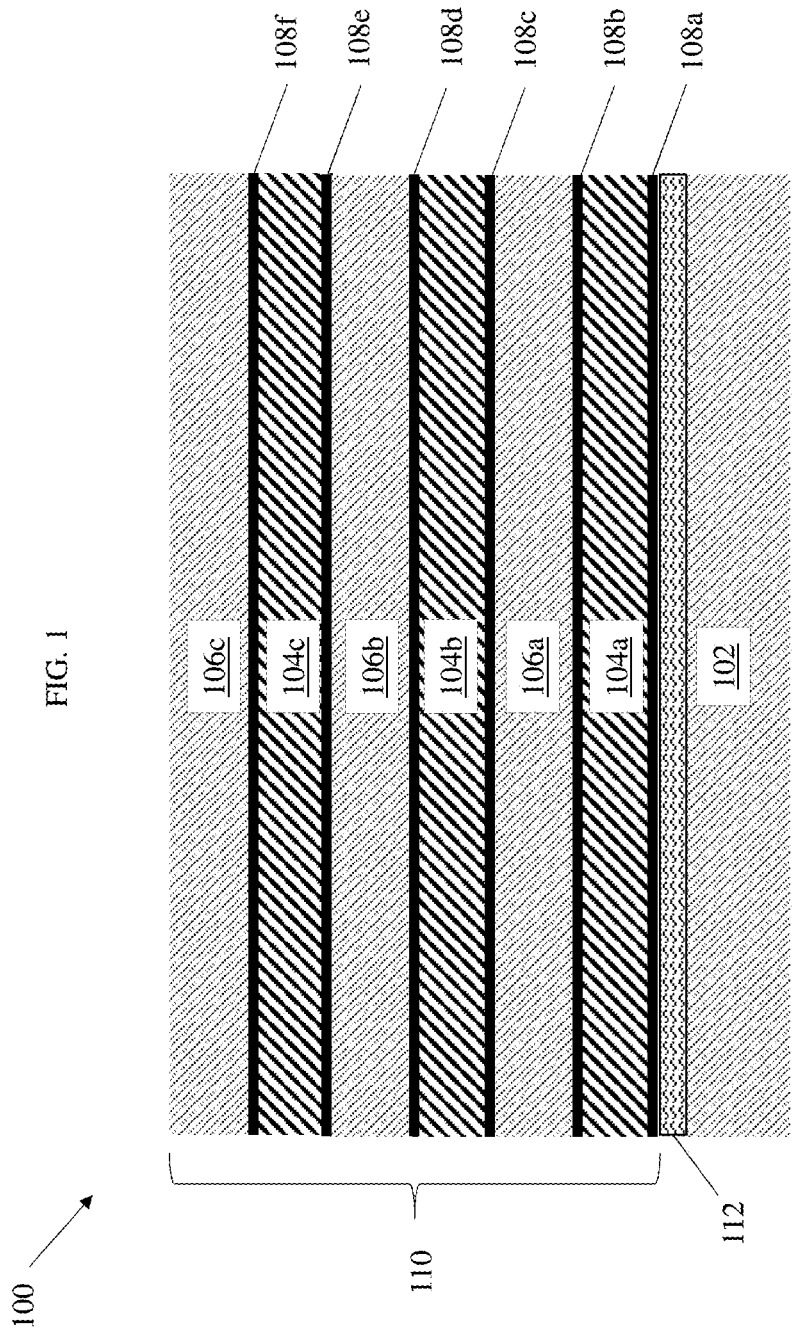
FIG. 1 depicts a cross-sectional view of a semiconductor device after a fabrication stage according to one or more embodiments of the present invention.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, the previously described nanosheet FET is a known architecture for providing a relatively small FET footprint by forming the channel region as a series of nanosheets. A nanosheet-based FET includes a source region, a drain region and stacked nanosheet channels between the source and drain regions. A gate surrounds the stacked nanosheet channels and regulates electron flow through the nanosheet channels between the source and drain regions. Typical nanosheet FETs are fabricated by forming alternating layers of channel nanosheets and sacrificial nanosheets. The sacrificial nanosheets are released from the channel nanosheets before the FET device is finalized. For such FETs, the channel nanosheets are silicon (Si) and the sacrificial nanosheets are generally formed of silicon germanium (SiGe). Herein, the sacrificial nanosheets are formed of a combination of layers. In particular, the sacrificial layers include a SiGe layer of a first Ge concentration (e.g., 40%) sandwiched by or displaced between two thin (e.g., thinner than the SiGe layer of the first Ge concentration) low SiGe layers having a lower Ge concentration (e.g., 10%).

One reason why the sacrificial layers can be utilized is that, in a final product, a nanosheet channel can have a gate wrapping around the nanosheet. Thus, the sacrificial layers form a space where the final gate materials (e.g., high-k gate dielectric and metal gate conductor) can be introduced by removing the sacrificial layers and replacing them with a final gate materials. Such a process can be referred to a "replacement metal-gate" (RMG) Process. The advantage of RMG processing is that the final gate stack is formed in the late stage of transistor fabrication so that undesired impact of early processes (e.g., high thermal budget processing such as source/drain dopant activation) on gate stack can be minimized.

In some instance, an inner spacer needs to be included between the high-k dielectric/metal gate material and the source/drain. To this end, when preparing the sacrificial layers, a so-called inner spacer is formed that will serve the purpose of separating the sacrificial layers from the source/drain. The inner spacer is sized to reduce parasitic capacitance between gate and S/D regions. In some cases, a minimum 5 nm thick inner spacer is required.

However, conventional inner spacer formation processes lead to creation of curved-shaped spacers that can leads to the variation and non-uniform thickness of inner spacer. Such processes can also results in etching of the source/drain through thin inner spacer regions during sacrificial SiGe channel release.

Described herein is a method of forming inner spacers that have a more uniform thickness. Such a uniform thickness can reduce or eliminate effects of a non-uniform spacer such as, etching of the source/drain during channel release or variations in parasitic capacitance to name but a few.

While a high-k dielectric/metal gate material is described herein as the gate material, the teachings herein can be applied to any type of nanosheet gate devices.

FIGS. 1-16 are diagrams illustrating a semiconductor structure 100 after selected stages of a replacement gate fabrication methodology for forming an exemplary nanosheet FET according to one or more embodiments of the present invention. As described in greater detail herein below, in accordance with one or more embodiments of the present invention, the process described herein results in more uniform shapes of the spacers 1230 (FIG. 12) than in prior methods.

FIG. 1 depicts a cross-sectional view of the semiconductor device 100 having a substrate 102 and a stack 110 of series of silicon germanium (SiGe) sacrificial nanosheets 104a-104c and silicon (Si) channel nanosheets 106a-106c. While three layer of each of the SiGe sacrificial nanosheets 104a-104c and Si channel nanosheets 106a-106c are shown in the stack 110, the teachings herein can be applied to any situation that includes a stack of nanosheets with one or more SiGe sacrificial nanosheets and one or more Si channel nanosheets.

Also included in the stack 110 are low SiGe containing layers 108a-108f. Each pair of low SiGe containing layers sandwiches a sacrificial SiGe sacrificial nanosheets 104a-104c. That is, low SiGe containing layers 108a and 108b surround and are disposed on opposing side of a first SiGe sacrificial nanosheet 104a, low SiGe containing layers 108c and 108d surround and are disposed on opposing side of a second SiGe sacrificial nanosheet 104b, and low SiGe containing layers 108e and 108f surround and are disposed on opposing side of a third SiGe sacrificial nanosheet 104c.

Herein, from time to time, the SiGe containing layers 108a-108c can be referred to as low SiGe containing layers. The term "low" herein means that the concentration of the Ge in those layers is lower (e.g., less than) the concentration of the Ge in the SiGe sacrificial nanosheets. In some embodiments of the invention, the Ge content of the high Ge containing layers (SiGe sacrificial nanosheets) can be 40% the Ge content of the low Ge containing layers can be 10%. In some embodiments of the invention, the Ge content of the high Ge containing layers can be between 35% and 45% the Ge content of the low Ge containing layers can be between 5% and 15%.

In some embodiments of the invention, the nanosheet stack 110 is formed on a dielectric (e.g., oxide, nitride, or any other suitable dielectric material or combination of those dielectric materials) isolation layer 112, which is formed on the silicon substrate 102. It shall be understood that this layer can be omitted in one embodiment.

In one or more embodiments of the invention, the alternating series of silicon germanium sacrificial nanosheets 104a-104c, the low Ge containing layers 108a-108f and silicon channel nanosheets 106a-106c are formed by epitaxially growing one layer and then the next until the desired number and desired thicknesses of the nanosheets are achieved. For instance, a first low Ge containing layer 108a can be grown, then a first silicon germanium sacrificial nanosheet 104a can be grown on the a first low Ge containing layer 108a. A second low Ge containing layer 108b is grown on the first silicon germanium sacrificial nanosheet 104a. A first silicon channel nanosheet 106a is then grown on the second low Ge containing layer 108b and so on. In some embodiments of the invention, the silicon channel nanosheets 106 and the low Ge containing layers 108 surround a particular layer are formed directly on each other with no layers between them.

Epitaxial materials can be grown from gaseous or liquid precursors. Epitaxial materials can be grown using vapor-phase epitaxy (VPE), molecular-beam epitaxy (MBE), liquid-phase epitaxy (LPE), rapid thermal chemical vapor deposition (RTCVD), metalorganic chemical vapor deposition (MOCVD), ultrahigh vacuum chemical vapor deposition (UHVCVD), low-pressure chemical vapor deposition (LPCVD), limited reaction processing CVD (LRPCVD), or other suitable process. In some embodiments, epitaxial silicon and silicon germanium can be doped during deposition (in-situ doped) by adding dopants depending on the type of transistor. In other embodiments, no dopants are intentionally added to the epitaxial silicon and silicon germanium.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments of the invention, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 2:
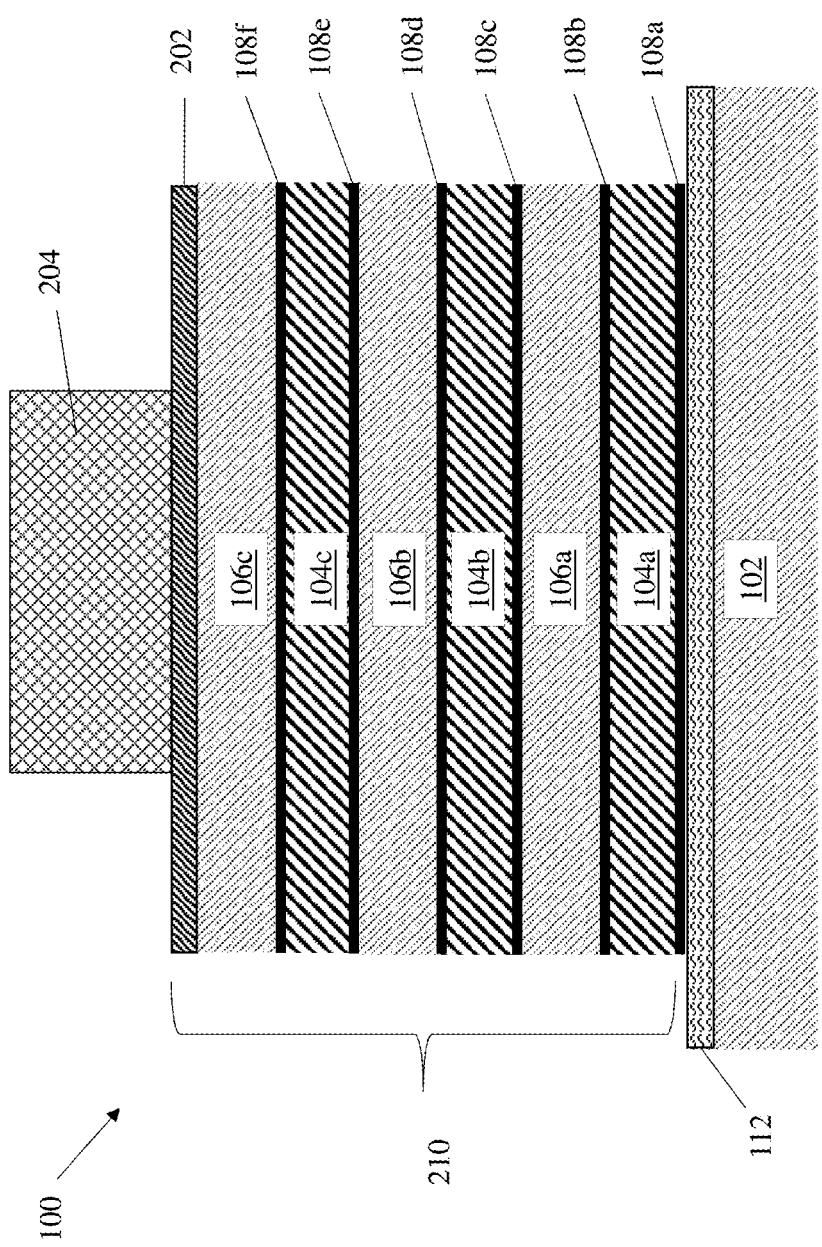
FIG. 2 depicts a perspective view of a semiconductor device after a fabrication stage according to one or more embodiments of the present invention.

As more fully described below, the generally process of forming a sacrificial gate stack as disclosed herein is to form a nanosheet stack on a substrate; pattern the nanosheet stack into stripes (or sometimes called fins as shown in FIG. 2); form a dummy gate stack including dielectric (e.g., oxide) layer 202 and dummy gate 204 on top and on sidewalls of the nanosheet stack; and patter the dummy gate stack by any known patterning techniques such as lithography followed by etching to form the dummy gate stack shown in FIG. 4. Other suitable techniques, such as sidewall image transfer (SIT), self-aligned double patterning (SADP), and self-aligned quadruple patterning (SAQP), etc.

FIG. 2 shows the device 100 after deposition of a dummy oxide layer 202 is disposed on top of the third silicon channel nanosheet 106c. In embodiments of the invention, the stack 110 can be transformed to a channel nanosheet stack 210 by patterning the dummy oxide layer 202 and etching. A dummy gate 204 is formed on a top of the dummy oxide layer 204 by known processes.

For example, the known processing techniques can include the formation of dummy oxide layer 202 (not shown) over silicon channel nanosheet 106c. The fin hard masks can be formed by first depositing the hard mask material (for example silicon nitride) onto silicon channel nanosheet 108c using, for example, chemical vapor deposition (CVD), plasma enhanced CVD (PECVD) or any suitable technique for dielectric deposition that does not induce a physical or chemical change to silicon channel nanosheet 108c. The deposited hard mask material is then patterned into an individual gate (or fin) hard masks. The patterning of the hard masks is commensurate with a desired footprint and location of the channel nanosheet stack 210shown in FIG. 2, which will be used to form the channel regions of the semiconductor device. According to embodiments of the invention, RIE is used to etch through the alternating series of silicon germanium sacrificial nanosheets 104a-104c, the low Ge containing layers 108a-108c and silicon channel nanosheets 106a-106c to form the nanosheet stack 210.

The dummy gate 204 can be formed of amorphous silicon in embodiments of the invention and deposited and formed in a manner similar to that described above or any other manner known to the skilled artisan. The dummy gate 204 may further comprise hardmask layer or layers on top of the amorphous silicon.

Figure 3:
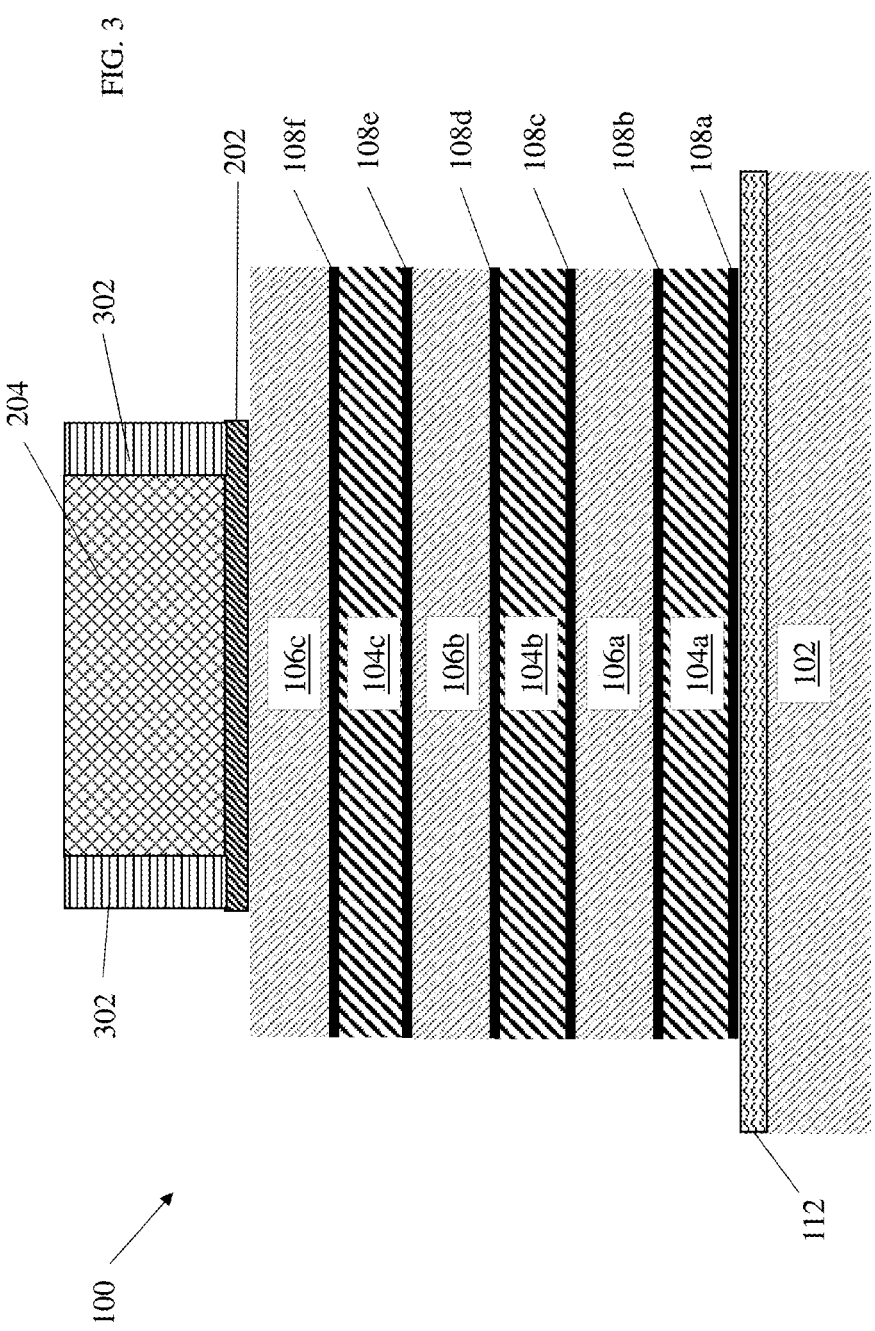
FIG. 3 depicts a cross-sectional view of a semiconductor device after a fabrication stage according to one or more embodiments of the present invention.

FIG. 3 shows the structure 100 after spacers 302 are formed on the one sidewalls of the dummy gate 204. The spacers 302 are formed of silicon nitride (SiN) in some embodiments of the invention and are formed by deposition (e.g., CVD or ALD) and then a reactive ion etch (RIE) process. Other spacer materials: silicon oxynitride, boron nitride, SiOCN, SiBCN, SiOC, SiCN, or any combination of these materials could be used.

Figure 4:
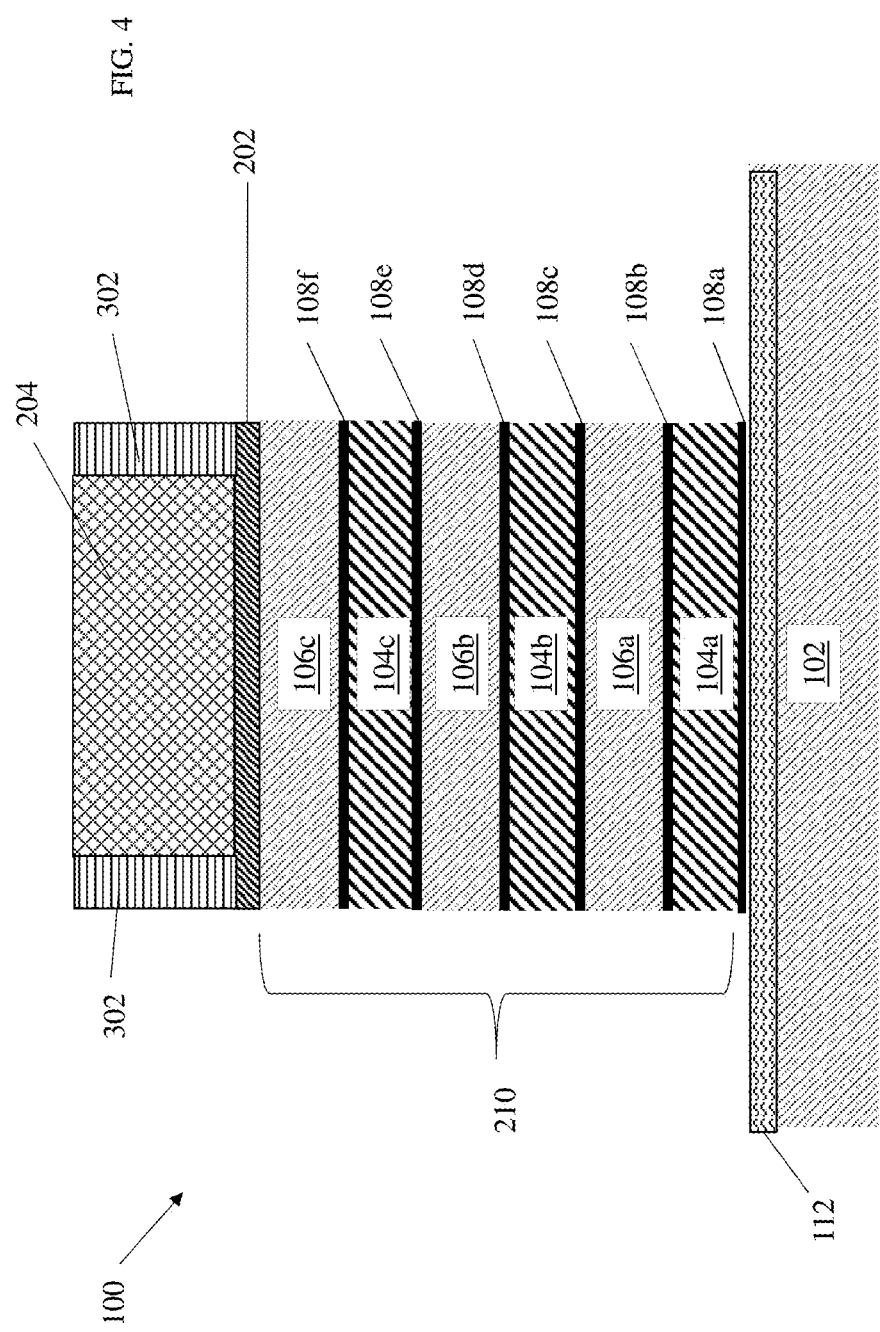
FIG. 4 depicts a perspective view of a semiconductor device after a fabrication stage according to one or more embodiments of the present invention.

FIG. 4 shows the structure 100 after the dummy gate 204 and the spacers 302 have been used as mask to remove the portion of the stack that extend beyond the outer ends of the spacers 302. The removal can be performed, in some embodiments of the invention, using an anisotropic etch such as reactive ion etch (RIE) process.

Figure 5:
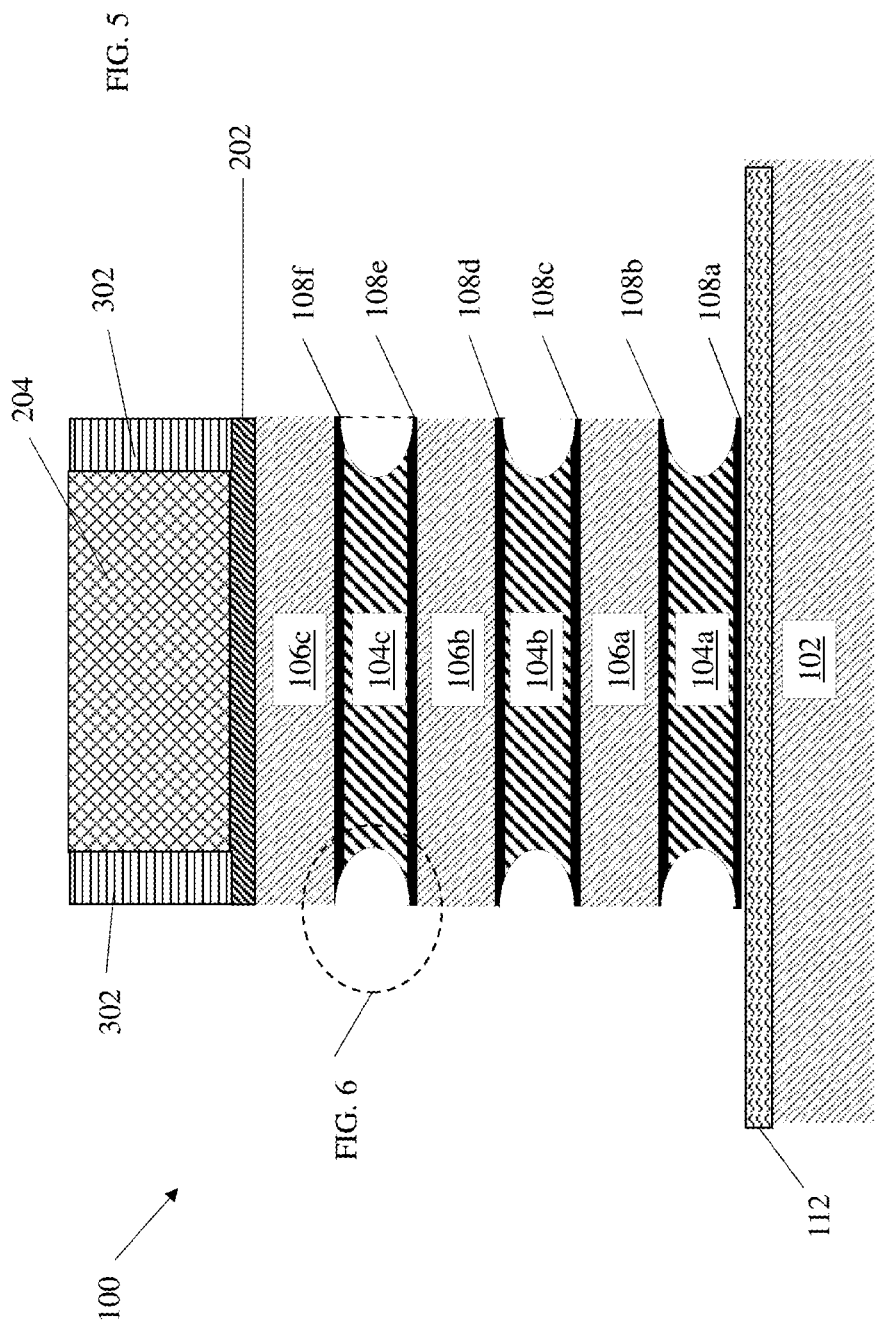
FIG. 5 depicts a cross-sectional view of a semiconductor device after a fabrication stage according to one or more embodiments of the present invention.

FIG. 5 shows the structure 100 after a partial removal of the sacrificial SiGe layers 104a-104c according to one embodiment. In addition, a portion of the low Ge containing layers 108a-108f is also removed. In some embodiments of the invention, the removal of the sacrificial SiGe nanosheets 104a-104c and the low Ge containing layers 108a-108f can be achieved by a wet etch. In some embodiments of the invention, the wet etch is timed etch. The wet etch can include using a mixture of ammonia and hydrogen peroxide in some embodiments of the invention. In some embodiments of the invention, the wet etch is selected such that it will cause portions of any layer that includes Ge to be removed. In some embodiments of the invention, the amount of material that is etched away increases as the amount of Ge in a particular layer increases. Alternatively, in some embodiments of the invention, the removal of the sacrificial SiGe nanosheets 104a-104c and the low Ge containing layers 108a-108f can be achieved by a vapor etch. The vapor etch can include using gas phase hydrogen chloride (HCl) in some embodiments of the invention.

Figure 6:
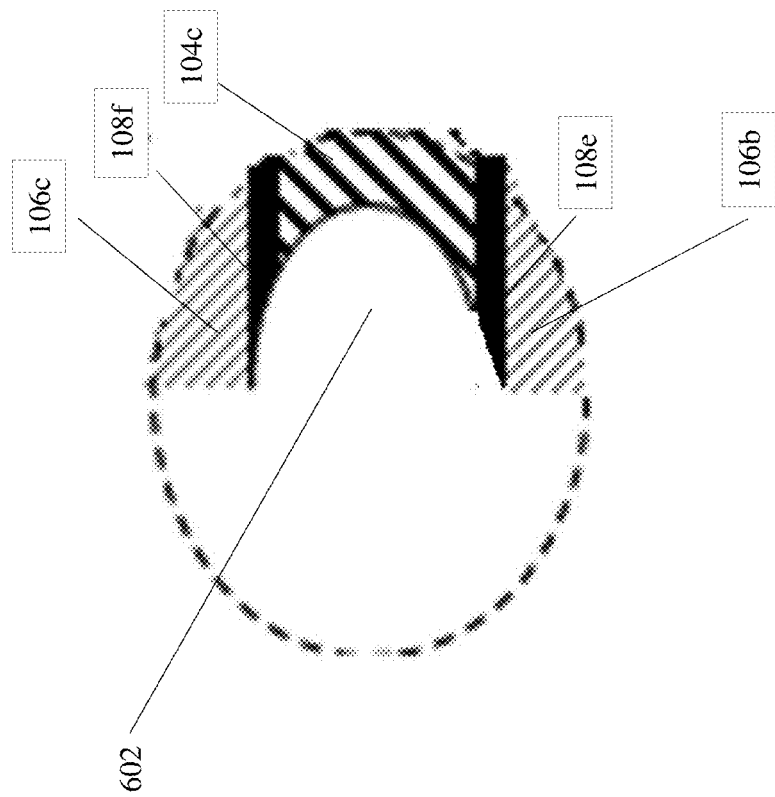
FIG. 6 depicts an exploded view of a portion of FIG. 5.

With reference to FIGS. 5 and 6, and with the understanding that etch rates are proportional to Ge content, the result of the etch is to form a curved-shaped indent 602. In particular, more of the sacrificial SiGe nanosheet 104c is etched away than the low Ge containing layers 108e-108f.

Figure 7:
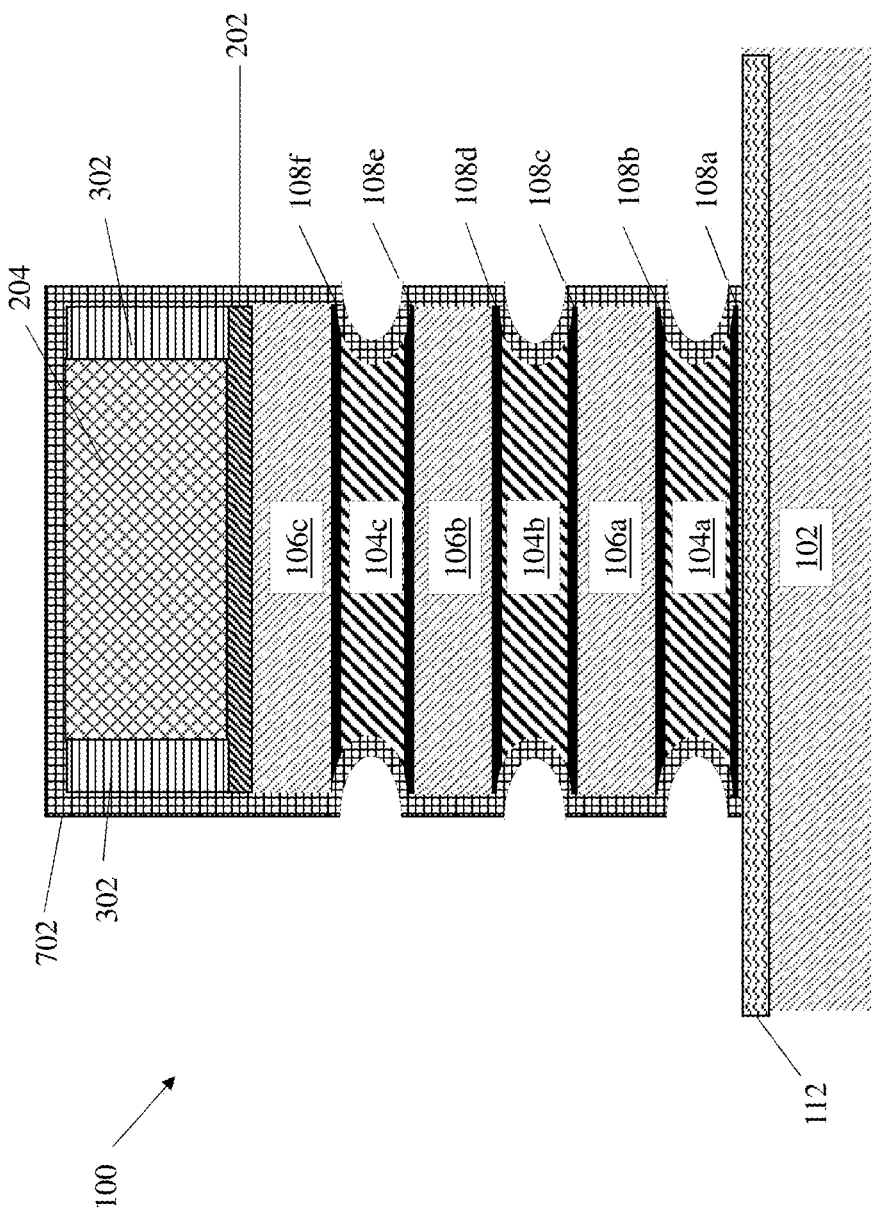
FIG. 7 depicts a cross-sectional view of a semiconductor device after a fabrication stage according to one or more embodiments of the present invention.

After formation of the half-moons 602, at uniform layer 702 of germanium oxide ($GeO_2$) is deposited by an ALD process as illustrated in FIG. 7. Alternatively, the germanium oxide can be deposited by a CVD process.

Figure 8:
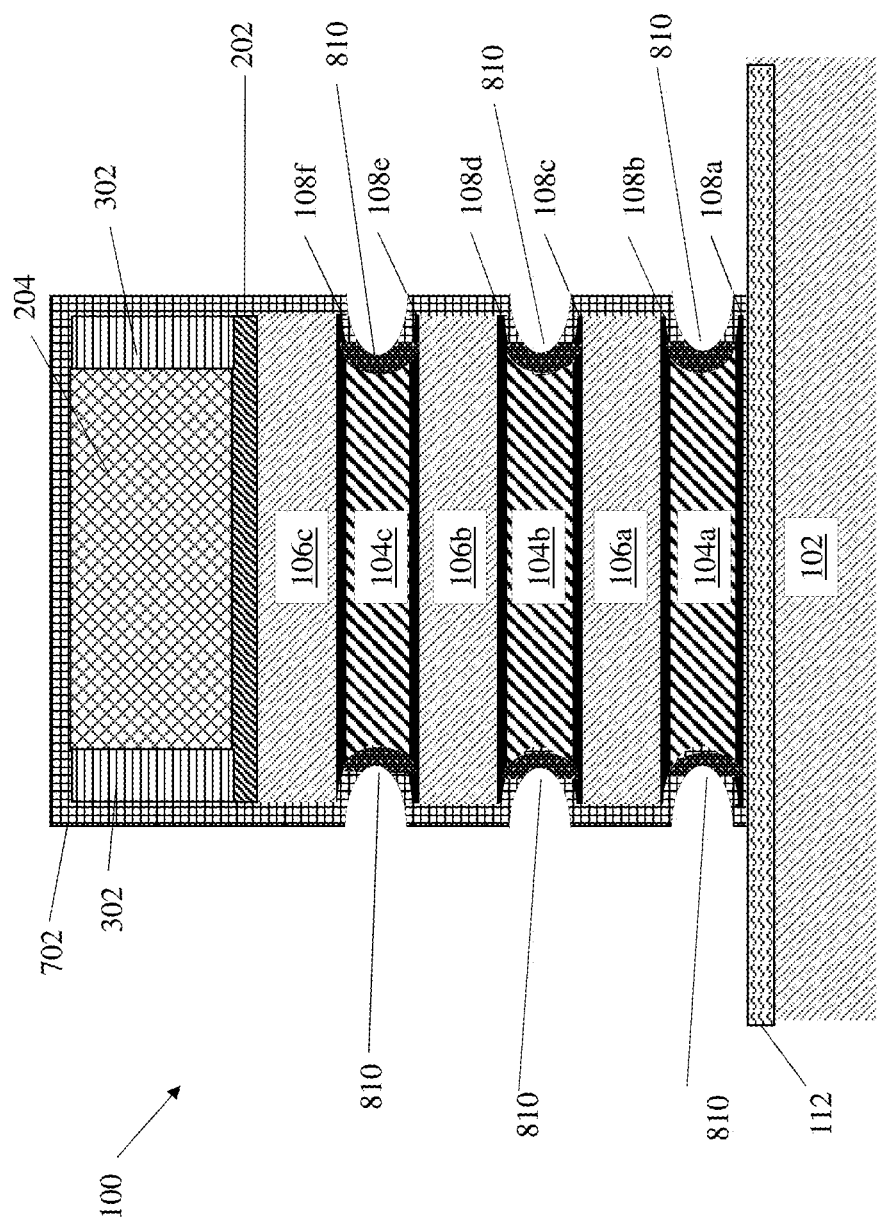
FIG. 8 depicts a perspective view of a semiconductor device after a fabrication stage according to one or more embodiments of the present invention.

FIG. 8 shows the structure 100 after it has been subjected to an annealing process. The annealing process is performed, in one embodiment, at a temperature of lower than about 600 degrees Celsius. The result of such an anneal is the formation of $SiO_2$ nano-masks 810 at locations where the layer 702 and the sacrificial SiGe nanosheets 104a-104c contact one another that are a result of interactions between the $GeO_2$ layer 702 and the sacrificial SiGe nanosheets 104a-104c. At temperatures below about 600 degrees Celsius, there is little to no reaction between the low Ge containing layers 108a-108f and the $GeO_2$ layer 702.

Figure 9:
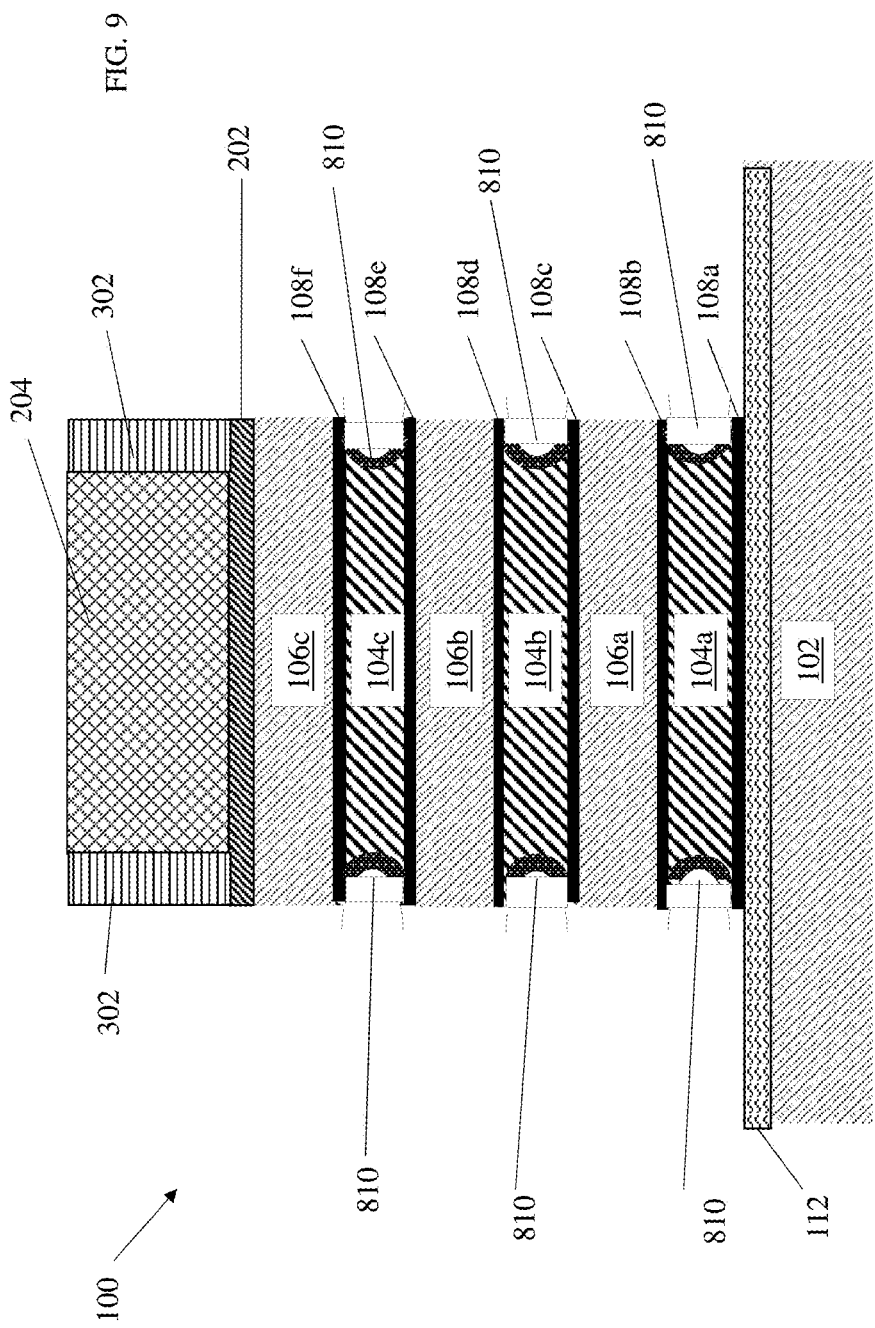
FIG. 9 depicts a cross-sectional view of a semiconductor device after a fabrication stage according to one or more embodiments of the present invention.

The unreacted portions of the $GeO_2$ layer 702 can be removed by exposing it to a water containing wash because $GeO_2$ is water soluble. The result of such a wash is shown in FIG. 9 where only the $SiO_2$ nano-masks 810 created by the anneal remain on the outer edges of the of sacrificial SiGe nanosheets 104a-104c.

Figure 10:
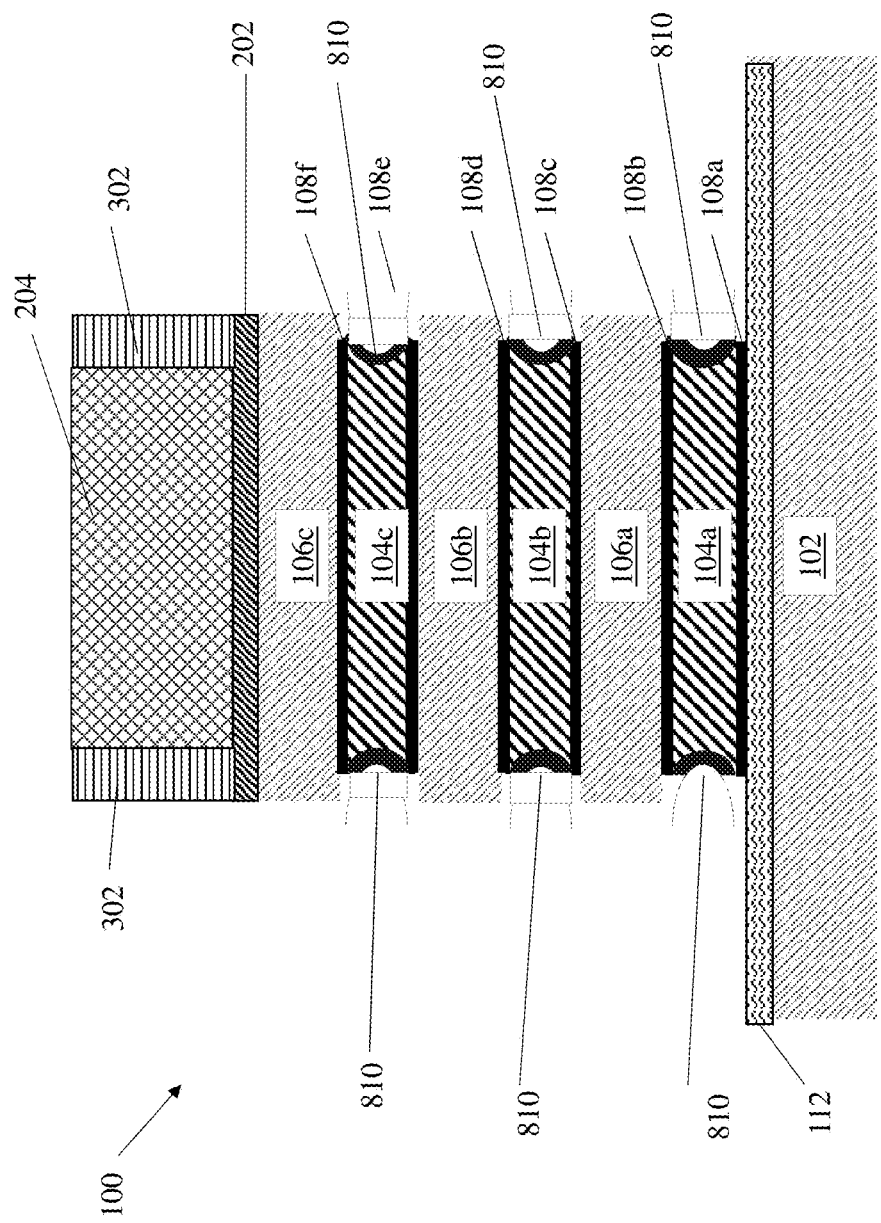
FIG. 10 depicts a perspective view of a semiconductor device after a fabrication stage according to one or more embodiments of the present invention.

The portions of the low Ge containing layers 108a-108f can be removed applying a second wet etch using a mixture of ammonia and hydrogen peroxide. Alternatively, in some embodiments of the invention, vapor etch using gas phase hydrogen chloride (HCl) can be used. This etch can be longer than the etching process described above with respect to FIG. 5. The longer etch time will allow the low Ge containing layers 108a-108f to be removed while the SiGe nanosheets 104a-104c are protected from the etch by the $SiO_2$ nano-masks 810 previously formed on ends of them. The result of such an etch is illustrated in FIG. 10.

Figure 11:
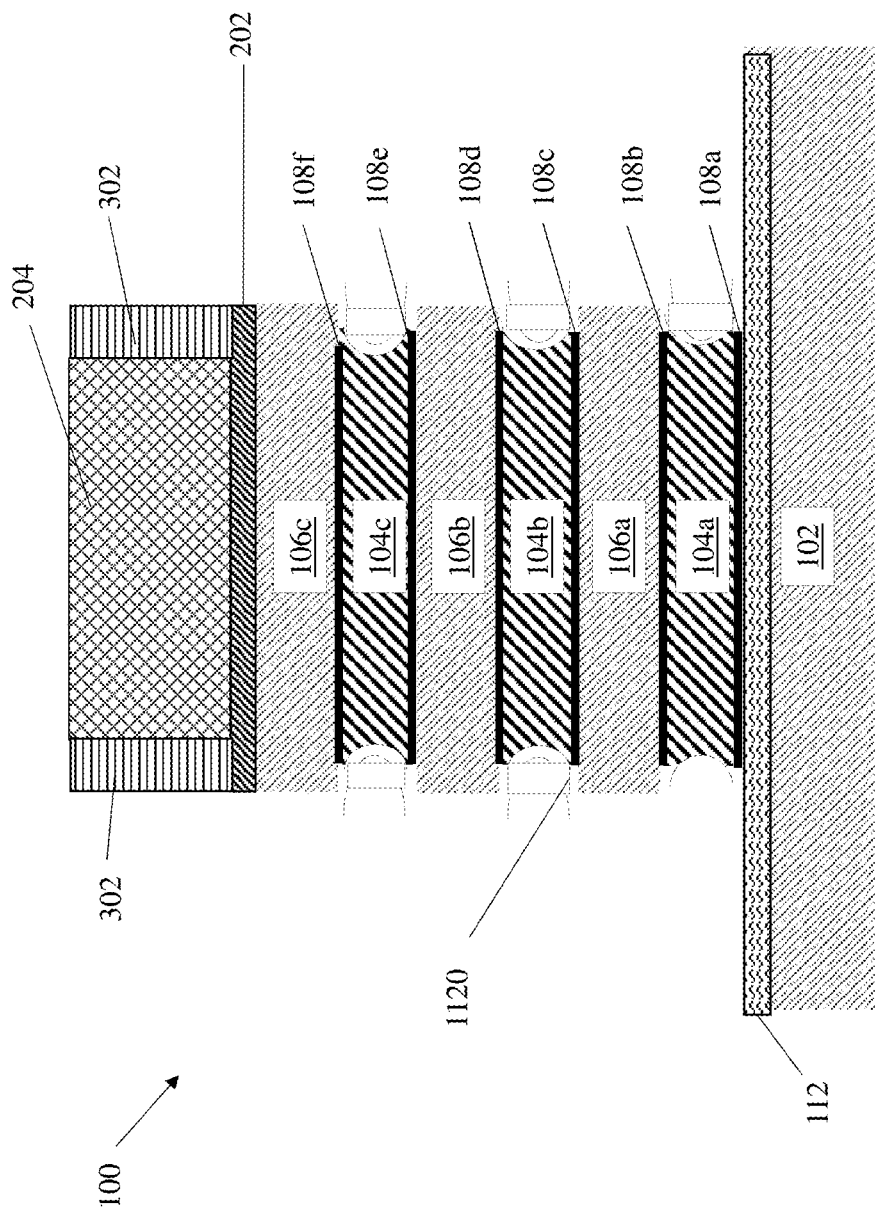
FIG. 11 depicts a cross-sectional view of a semiconductor device after a fabrication stage according to one or more embodiments of the present invention.

As shown in FIG. 11, $SiO_2$ nano-masks 810 can be removed by a hydrogen fluoride (HF) containing etch process. Alternatively, the nano-mask 810 can be removed by dry etch such as chemical oxide removal (COR) process. In some embodiments of the invention, the etch process includes using hydrofluoric acid. While not perfectly square, the resulting recesses (e.g., recess 1120) in the combination of layer between each of the silicon channel nanosheets 106a-106c (e.g., silicon germanium sacrificial nanosheet 104b and low Ge containing layers 108c-108d) are more uniform than in prior art method.

Figure 12:
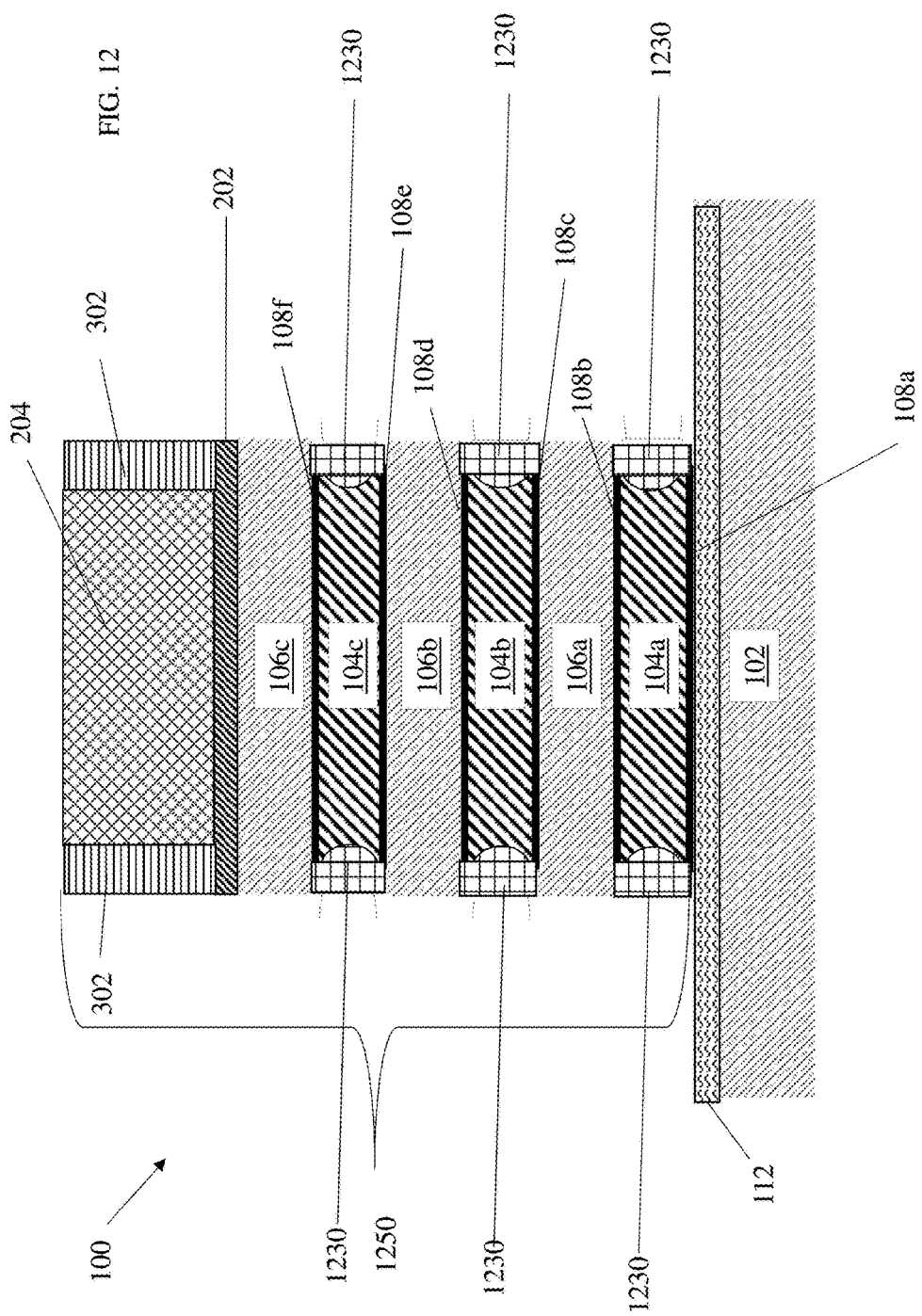
FIG. 12 depicts a perspective view of a semiconductor device after a fabrication stage according to one or more embodiments of the present invention.
Figure 13:
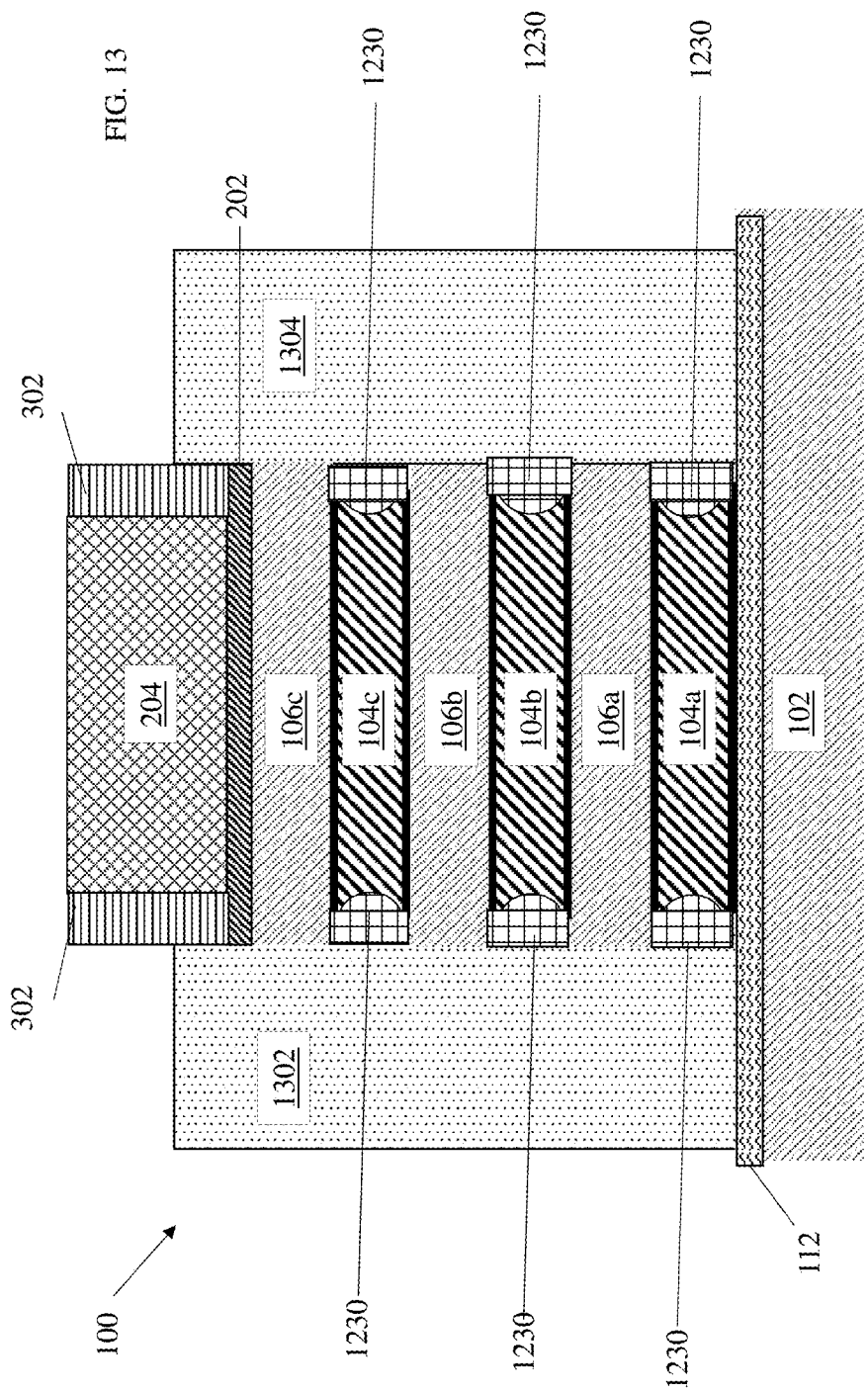
FIG. 13 depicts a perspective view of a semiconductor device after a fabrication stage according to one or more embodiments of the present invention.

With reference now to FIG. 12, when inner spacers 1230 are formed in recesses 1120, the shape of these inner spacers, while not perfectly square, are more uniform that in the prior art. In addition, having a uniform spacer 1230 will ensure that there are not "thin" areas where, during a sacrificial SiGe channel release process the etchant can pass through the spacer and etch the source/drain. The inner spacer 1230 can be formed by a conformal deposition (e.g., CVD or ALD) to plug the recesses followed by an etch back process to remove any excessive material. The inner spacer 1230 can have the same or different materials of the spacer 302. In some embodiments, the inner spacer 1230 can have different materials of the spacer 302. In one embodiment, the spacer 302 is SiBCN and the inner spacer 302 comprise silicon nitride (SiN).As shown in FIG. 13, after the inner spacers 1230 are formed, a source region 1302 and a drain region 1304 can be formed. In some embodiments, the source/drain regions are epitaxially grown on the sides of the gate stack 1250 shown in FIG. 12. If the transistor that is the end result of the process described herein is to be a pFET, the source/drain regions 1302/1304 can be formed of SiGe doped with boron and if it is to be an nFET the source/drain regions 1302/1304 can be silicon doped with phosphorus. Dopant types: n-type dopant selected from a group of phosphorus (P), arsenic (As) and antimony (Sb), and a p-type dopant selected from a group of boron (B), gallium (Ga), indium (In), and thallium (Tl). Besides in-situ doping (dopants are incorporated into epitaxial source/drain), other doping techniques can be used to add dopants to source/drain. Alternative doping techniques include but are not limited to, ion implantation, gas phase doping, plasma doping, plasma immersion ion implantation, cluster doping, infusion doping, liquid phase doping, solid phase doping, etc.

Figure 14:
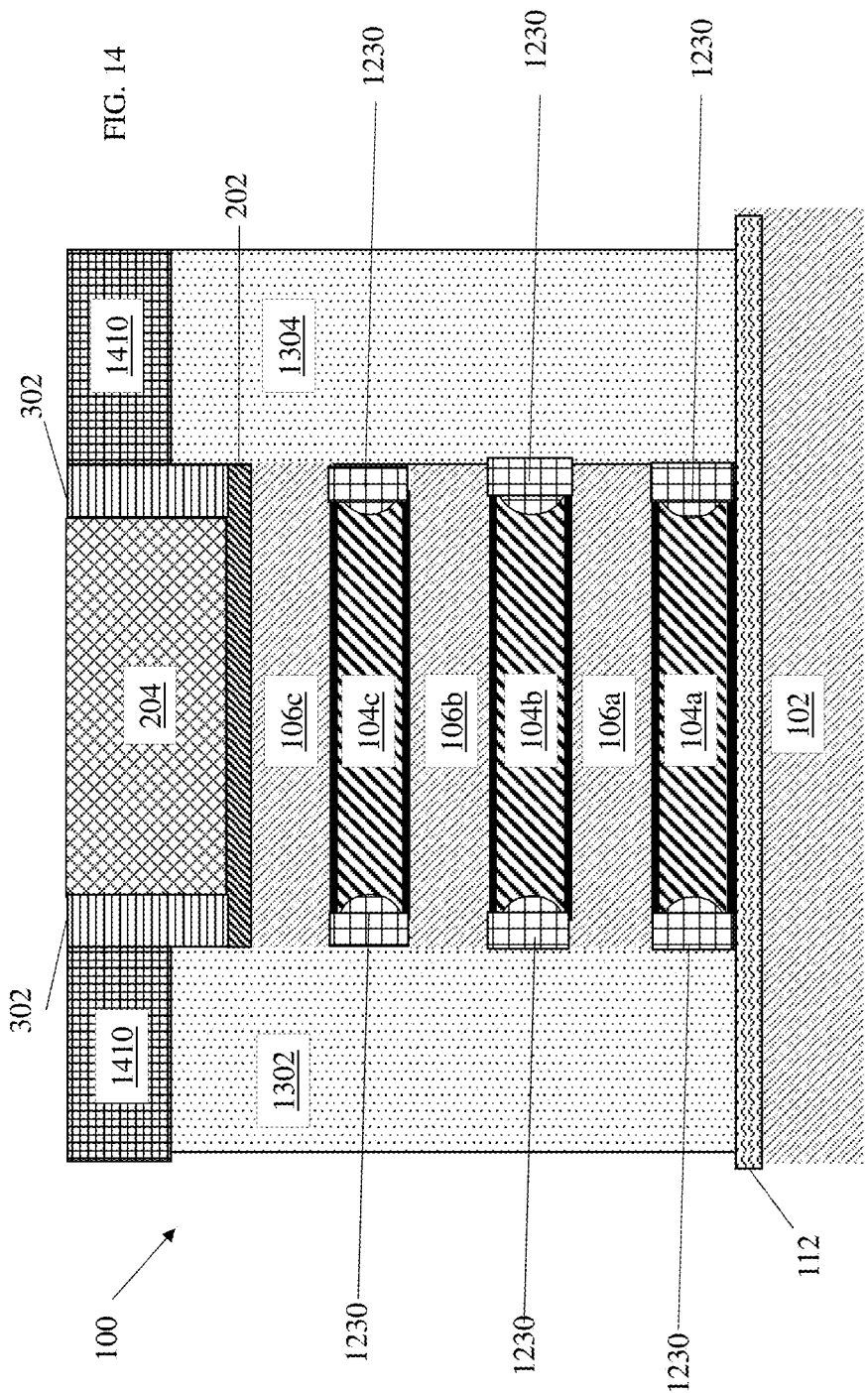
FIG. 14 depicts a perspective view of a semiconductor device after a fabrication stage according to one or more embodiments of the present invention.

At shown in FIG. 14, an interlayer dielectric layer (ILD) 1410 can be formed over the source/drain regions 1302/1304. The interlayer dielectric layer 1410 is an oxide in some embodiments of the invention that is deposited and then subjected to planarization process to reveal a top of the dummy gate 204. In some embodiments, the ILD 1410 may comprise multiple materials, for example, a silicon nitride liner and oxide fill.

Figure 15:
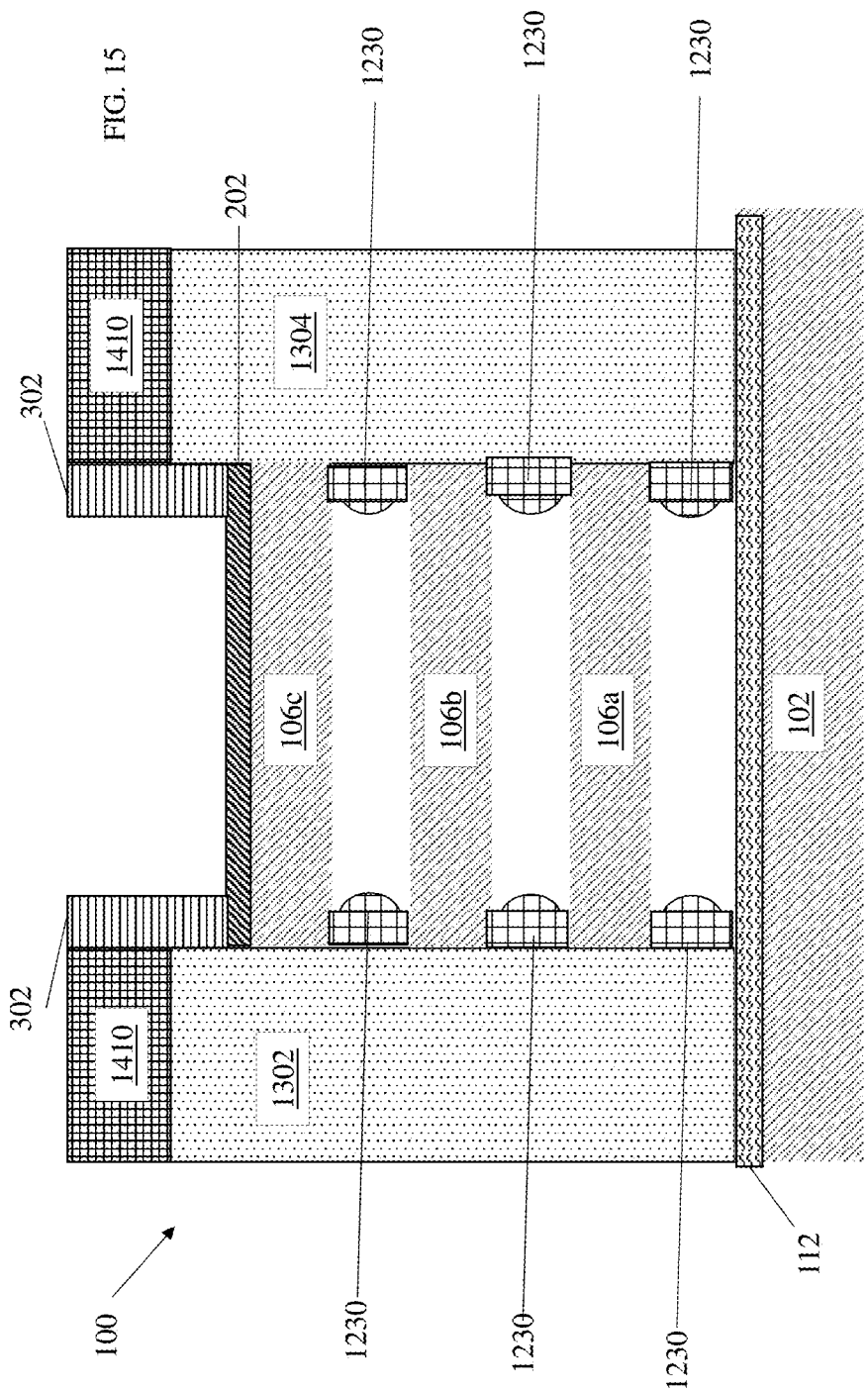
FIG. 15 depicts a perspective view of a semiconductor device after a fabrication stage according to one or more embodiments of the present invention.

The dummy gate 204 and all of the SiGe containing layers (e.g., nanosheets 104a-104c and layers 108a-108f) can be removed using any known processes to produce a structure 100 as shown in FIG. 15. For example, first the dummy gate 204 is removed. Depending on the dummy gate material(s), any suitable etch process or a combination of multiple etch processes can be used to remove dummy gate. For example, if the dummy gate 204 has a silicon nitride hardmask, it can be removed by silicon nitride etch (wets or dry etch). If the remaining dummy gate has amorphous silicon, it can be removed by dry silicon (e.g., plasma etch), wet etch (e.g., ammonia etch), or a combination of dry and wet etch processes. The sacrificial SiGe (layers 104 and 108) can be removed by wet etch or vapor etch described earlier. This process does not remove the inner spacers 1230. These spacers will serve to protect the source/drains regions 1302/1304 during the process of removing the SiGe containing layers. As will be understood, the ILD layer 1410 also serves this purpose on the tops of the source/drains regions 1302/1304.

Figure 16:
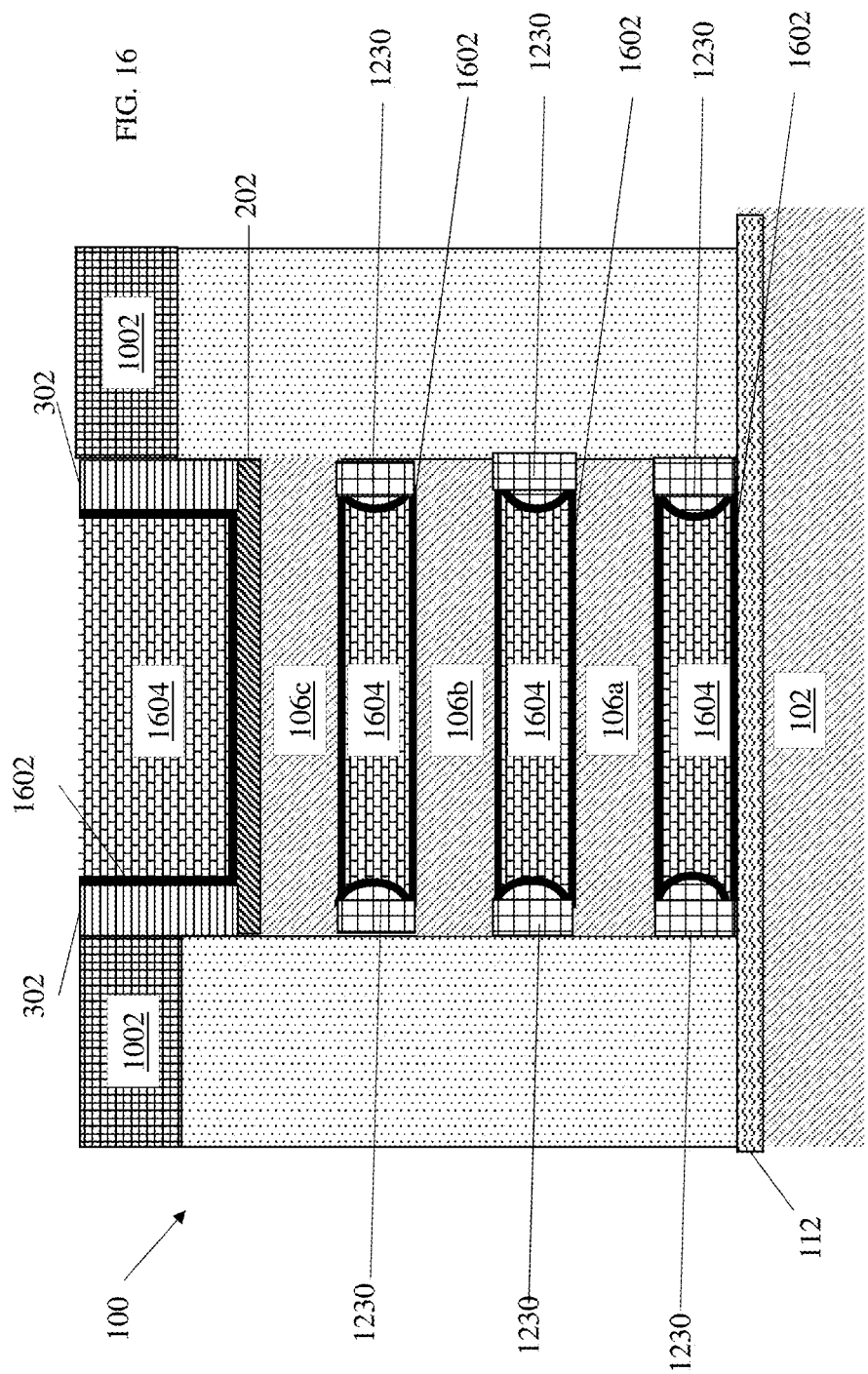
FIG. 16 depicts a perspective view of a semiconductor device after a fabrication stage and can represent a final gate stack according to one or more embodiments of the present invention.

A substantially completed FET is shown in FIG. 16 after depositions of a gate dielectric 1602 and a metal gate conductor material 1604 have been deposited. In some embodiments, the gate dielectric comprises a high-k material. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. In some embodiment, the gate dielectric may further comprises silicon oxide, silicon nitride, silicon oxynitride, or any suitable combination of those materials with high-k dielectric material. Gate dielectric can be deposited by chemical vapor deposition (CVD), atomic layer deposition (ALD), or any other suitable technique. The gate dielectric may have a uniform thickness in the non-limiting range of 1 nm to 3 nm.

The gate conductor may be formed of any suitable conducting material, including but not limited to, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. In some embodiments, the gate conductor includes a work function metal layer to set the threshold voltage of the transistor to a desired value. The work function layer may be a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC), titanium aluminum carbide (TiAlC), tantalum carbide (TaC), hafnium carbide (HfC), and combinations thereof. The gate conductor can be formed by using a conformal deposition process such as atomic layer deposition (ALD), chemical vapor deposition (CVD), physical vapor deposition (PVD), or sputtering processing, although other suitable processes may be used.

The methods as described herein can be used in the fabrication of FET's that can be included in integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). From time to time herein, the term layer and sheet (or nanosheet) can be used interchangeably when describing certain elements.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop.

As previously noted herein, for the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device having an etch-resistant interlayer dielectric that maintains height during a top epitaxy clean according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, and atomic layer deposition (ALD) among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the embodiments in the form described. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of forming a nanosheet transistor comprising:
forming a substrate;
forming a first low germanium (Ge) containing layer over the substrate;
forming a first silicon germanium (SiGe) sacrificial nanosheet over the first low Ge containing layer, wherein the first SiGe sacrificial nanosheet has a higher Ge content than the first low Ge containing layer;
forming a second low Ge containing layer on the first SiGe sacrificial nanosheet;
forming a first silicon channel nanosheet on the second low Ge containing layer;
performing a first etch on the first and second low Ge containing layers and the SiGe sacrificial nanosheet to form first recesses in the SiGe sacrificial nanosheet;
depositing a layer of germanium oxide over the substrate and the first silicon channel nanosheet and on sides of the first and second low Ge containing layers and sides of the first SiGe sacrificial nanosheet to form an intermediate gate stack;
annealing the intermediate gate stack to produce a silicon oxide where the layer of germanium oxide contacts the first SiGe sacrificial nanosheet in the first recesses;
removing the layer of germanium oxide;
performing a second etch on the first and second low Ge containing layers;
removing the silicon oxide to form recesses between the substrate and first silicon channel nanosheet;
forming spacers in the uniform recesses to create a modified sacrificial gate stack;
forming a source on side of the modified sacrificial gate stack and a drain on another side of the modified sacrificial gate stack;
removing the first and second low Ge containing layers and the SiGe sacrificial nanosheet from the modified sacrificial gate stack; and
forming a final gate stack by depositing a metal in regions formerly occupied by the first and second low Ge containing layers and the SiGe sacrificial nanosheet.

2. The method of claim 1, wherein the concentration of Ge in the first and second low germanium (Ge) containing layers comprises about 10%.

3. The method of claim 1, wherein the concentration of Ge in the SiGe sacrificial nanosheet comprises about 40%.

4. The method of claim 1, further comprising:
forming a third low Ge containing layer on the first silicon channel nanosheet;
forming a second (SiGe) sacrificial nanosheet over the third low Ge containing layer;
forming a fourth low Ge containing layer on the second SiGe sacrificial nanosheet;
forming a second silicon channel nanosheet on the fourth low Ge containing layer;
forming a fifth low Ge containing layer on the second silicon channel nanosheet;
forming a third SiGe sacrificial nanosheet over the fifth low Ge containing layer;
forming a sixth low Ge containing layer on the third SiGe sacrificial nanosheet; and
forming a third silicon channel nanosheet on the sixth low Ge containing layer.

5. The method of claim 4, further comprising:
forming a dummy gate stack on top and sidewalls of the nanosheet stack; and
forming a dielectric spacer spacers on sides of the dummy gate;
wherein the intermediate gate stack includes the dummy gate and the dielectric spacers.

6. The method of claim 1, wherein the intermediate gate stack is annealed.

7. The method of claim 1, wherein water is used to remove the layer of germanium oxide.

8. The method of claim 1, wherein the first and second etches are time etches.

9. The method of claim 8, wherein the first and second etches are performed with an aqueous solution containing the mixture of ammonia and hydrogen peroxide.

* * * * *